United States Patent
Ganesan et al.

(10) Patent No.: US 10,483,997 B1
(45) Date of Patent: Nov. 19, 2019

(54) CIRCUIT FOR FREQUENCY TO TIME DOMAIN CONVERSION

(71) Applicant: TEXAS INSTRUMENTS INCORPORATED, Dallas, TX (US)

(72) Inventors: Aravind Ganesan, Bengaluru (IN); Jaiganesh Balakrishnan, Bengaluru (IN); Sashidharan Venkatraman, Bengaluru (IN); Bragadeesh Suresh Babu, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/281,862

(22) Filed: Feb. 21, 2019

Related U.S. Application Data

(60) Provisional application No. 62/787,024, filed on Dec. 31, 2018.

(30) Foreign Application Priority Data

Nov. 2, 2018 (IN) .............................. 201841041551

(51) Int. Cl.
  *H03M 1/12* (2006.01)
  *H03M 1/06* (2006.01)
(52) U.S. Cl.
  CPC ........... *H03M 1/1215* (2013.01); *H03M 1/06* (2013.01); *H03M 1/1255* (2013.01)
(58) Field of Classification Search
  CPC ..... H03M 1/1215; H03M 1/1255; H03M 1/06
  USPC ......................................................... 341/166
  See application file for complete search history.

(56) References Cited

U.S. PATENT DOCUMENTS

| | | | | |
|---|---|---|---|---|
| 7,042,937 B2 * | 5/2006 | Birru | ................. | H04L 25/03006 333/18 |
| 7,860,179 B2 * | 12/2010 | Bar-Ness | .............. | H04W 52/42 375/260 |
| 9,800,449 B2 * | 10/2017 | Yensen | .................... | H04B 1/06 |

* cited by examiner

*Primary Examiner* — Brian K Young
(74) *Attorney, Agent, or Firm* — John R. Pessetto; Charles A. Brill; Frank D. Cimino

(57) ABSTRACT

A method for frequency domain to time domain conversion includes receiving a set of frequency-domain samples. Based on the set of frequency-domain samples, a first sample subset comprising a predetermined fraction of the number of samples of the set of frequency-domain samples and a second sample subset comprising the predetermined fraction of the number of samples of the set of frequency-domain samples are generated. A linear phase rotation is applied to the first sample subset and the second sample subset to produce a phase rotated first sample subset and a phase rotated second sample subset. The phase rotated first sample set is post-processed to generate a first set of time-domain samples. The phase rotated second sample set is post-processed to generate a second set of time-domain samples. The first set of time-domain samples and the second set of time-domain samples are reordered to produce an output set of time-domain samples.

21 Claims, 3 Drawing Sheets

US 10,483,997 B1

CIRCUIT FOR FREQUENCY TO TIME DOMAIN CONVERSION

CROSS-REFERENCE TO RELATED APPLICATIONS

The present application claims priority to India Provisional Patent Application No. 201841041551, filed Nov. 2, 2018, entitled "Optimized Time-Frequency Conversion," and to U.S. Provisional Patent Application No. 62/787,024, filed Dec. 31, 2018, entitled "Circuit for Frequency to Time Domain Conversion," each of which is hereby incorporated herein by reference in its entirety.

BACKGROUND

Various electronic systems include frequency to time domain conversion and vice-versa. In one example, an impairment correction circuit estimates the error introduced into a signal by imperfections in the system and attempts to correct the errors by applying a modification to the signal. An interleaved analog-to-digital converter (ADC) includes an error correction circuit that estimates the error introduced in a digital sample stream by interleaving errors caused by imperfections, such as different offsets or gains, in the interleaved ADCs, and applies a filter to the digital sample stream to correct the errors. Many such circuits estimate the errors in the frequency domain and apply a time domain filter to correct the errors.

SUMMARY

Circuits and methods for frequency to time domain conversion are disclosed herein. In one example, a method for frequency to time domain conversion includes receiving a set of frequency domain samples. Based on the set of frequency domain samples, a first sample subset including a predetermined fraction of the number of samples of the set of frequency domain samples is generated, and a second sample subset including the predetermined fraction of the number of samples of the set of frequency domain samples is generated. A linear phase rotation is applied to the first sample subset and the second sample subset to produce a phase rotated first sample subset and a phase rotated second sample subset. The phase rotated first sample set is post-processed to generate a first set of time domain samples. The phase rotated second sample set is post-processed to generate a second set of time domain samples. The first set of time domain samples and the second set of time domain samples are reordered to produce an output set of time domain samples.

In another example, a circuit for frequency to time domain transformation includes a preprocessing circuit, a linear phase shift circuit, a post-processing circuit, and a remapping circuit. The preprocessing circuit is configured to receive a set of frequency domain samples, and to generate, based on the set of frequency domain samples: a first sample subset including a predetermined fraction of the number of samples of the set of frequency domain samples, and a second sample subset including the predetermined fraction of the number of samples of the set of frequency domain samples. The linear phase shift circuit is coupled to the preprocessing circuit. The linear phase shift circuit is configured to apply a first linear phase shift to the first sample subset to produce a phase rotated first sample set, and to apply a second linear phase shift to the second sample subset to produce a phase rotated second sample set. The first linear phase shift is different from the second linear phase shift. The post-processing circuit is coupled to the linear phase shift circuit, and is configured to: post-process the phase rotated first sample set to generate a first set of time domain samples, and post-process the phase rotated second sample set to generate a second set of time domain samples. The remapping circuit is coupled to the post-processing circuit, and is configured to reorder the first set of time domain samples and the second set of time domain samples to produce an output set of time domain samples.

In a further example, a mismatch correction system includes a mismatch estimation circuit, a frequency domain to time domain conversion circuit, and a mismatch correction circuit. The mismatch estimation circuit is configured to estimate, in the frequency domain, an impairment in an input signal. The frequency domain to time domain conversion circuit is configured to convert a set of frequency domain samples generated by the mismatch estimation circuit to time domain filter coefficients. The frequency domain to time domain conversion circuit is coupled to the mismatch estimation circuit, and includes a preprocessing circuit, a linear phase shift circuit, a post-processing circuit, and a remapping circuit. The preprocessing circuit is configured to generate, based on the set of frequency domain samples: a first sample subset comprising a predetermined fraction of the number of samples of the set of frequency domain samples, and a second sample subset comprising the predetermined fraction of the number of samples of the set of frequency domain samples. The linear phase shift circuit is coupled to the preprocessing circuit, and is configured to: apply a first linear phase shift to the first sample subset to produce a phase rotated first sample set, and apply a second linear phase shift to the second sample subset to produce a phase rotated second sample set. The first linear phase shift is different from the second linear phase shift. The post-processing circuit is coupled to the linear phase shift circuit, and is configured to post-process the phase rotated first sample set to generate a first set of time domain samples, and post-process the phase rotated second sample set to generate a second set of time domain samples. The remapping circuit is coupled to the post-processing circuit, and is configured to reorder the first set of time domain samples and the second set of time domain samples to produce the time domain filter coefficients. The mismatch correction circuit is coupled to the frequency domain to time domain conversion circuit, and includes a time domain filter. The time domain filter is configured to apply the time domain filter coefficients to correct the impairment in the input signal.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In many systems that include impairment correction, the error in an input signal is estimated most efficiently in the frequency domain and the correction is applied most efficiently in the time domain. Thus, the input signal is converted from the time domain to the frequency domain for error estimation, and the frequency domain error estimation is converted to the time domain for use in correcting the input signal. The processing time needed to perform the conversion between time and frequency domains limits the update rate of the impairment estimation and correction.

The frequency-to-time domain conversion circuits and methods disclosed herein substantially reduce (e.g., by a factor of 8) the complexity of frequency domain to time domain conversion of an error estimate, which in-turn reduces the time needed to perform frequency to time domain conversion, and enables an increased error estimation and correction update rate. The circuitry required to perform the conversion is simplified by replacing complex multipliers with real multipliers. A shared post-processing is used to compute positive and negative index values of the time domain output, and conversion from frequency to time domain uses a single coefficient fetch per tap pair, thereby reducing the number of memory accesses in the post processing.

Figure 1:
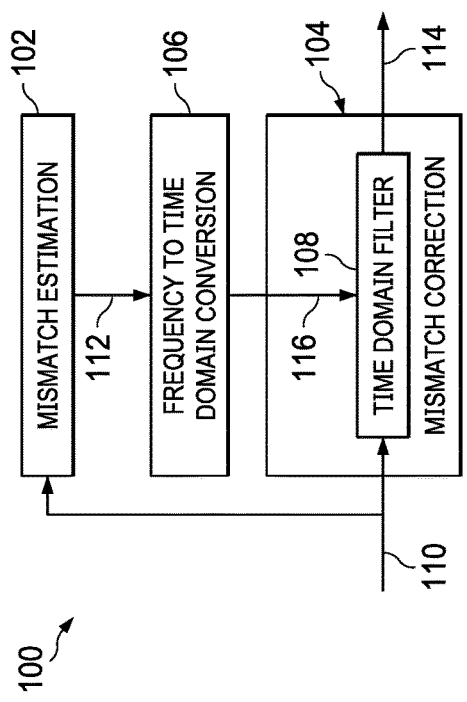
FIG. 1 shows block diagram for an example mismatch correction system in accordance with the present disclosure.

FIG. 1 shows block diagram for an example mismatch correction system 100 in accordance with the present disclosure. The mismatch correction system 100 may be included in an analog-to-digital converter, a wireless transceiver, or other system that provides correction for an impairment in a signal used in the system. The mismatch correction system 100 includes a mismatch estimation circuit 102, a mismatch correction circuit 104, and a frequency to time domain conversion circuit 106. The mismatch estimation circuit 102 and the mismatch correction circuit 104 receive time domain samples 110 (time domain input signal 110). The mismatch estimation circuit 102 includes circuitry that converts the time domain samples 110 to frequency domain samples and estimates, in the frequency domain, an impairment (i.e., an error) in the time domain samples 110. The estimation includes correlation and averaging of the frequency domain samples, mismatch estimation, filtering, and model fitting using frequency domain correlation. The mismatch estimation circuit 102 provides the frequency domain coefficients 112 (i.e., frequency domain samples 112) that describe the error to the frequency to time domain conversion circuit 106.

The frequency to time domain conversion circuit 106 converts the frequency domain samples 112 to time domain coefficients 116 (time domain samples 116) that are applied in the mismatch correction circuit 104 to generate the corrected signal 114 from the time domain samples 110. The number of the time domain samples 116 generated by the frequency to time domain conversion circuit 106 is substantially lower than the number of the frequency domain samples 112 received from the mismatch estimation circuit 102. For example, given 128 frequency domain samples 112, the frequency to time domain conversion circuit 106 may generate 17 time domain samples 116 for use in the mismatch correction circuit 104.

The mismatch correction circuit 104 a time domain filter 108 that applies the time domain coefficients 116 generated by the frequency to time domain conversion circuit 106 to correct the error in the time domain samples 110 and produce the corrected signal 114.

Figure 2:
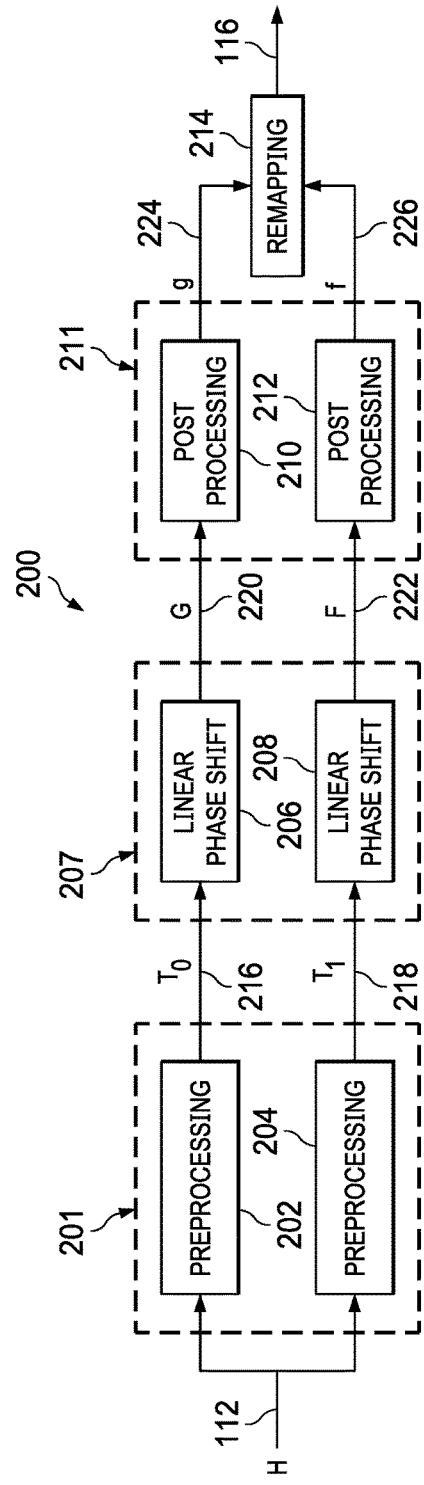
FIG. 2 shows a block diagram for an example frequency to time domain conversion circuit in accordance with the present disclosure.

FIG. 2 shows a block diagram for an example frequency to time domain conversion circuit 200 in accordance with the present disclosure. The frequency to time domain conversion circuit 200 is an implementation of the frequency to time domain conversion circuit 106. The frequency to time domain conversion circuit 200 processes the frequency domain samples 112 to generate the time domain samples 116. The frequency to time domain conversion circuit 200 includes a preprocessing circuit 202, a preprocessing circuit 204, a linear phase shift circuit 206, a linear phase shift circuit 208, a post-processing block 210, a post-processing block 212, and a remapping circuit 214. The preprocessing circuit 202 and the preprocessing circuit 204 (collectively preprocessing circuit 201) receive the frequency domain samples 112 from a data source, such as the mismatch estimation circuit 102. Each of the preprocessing circuit 202 and the preprocessing circuit 204 processes the frequency domain samples 112 to generate a sample subset one-half the size of the frequency domain samples 112. The preprocessing circuit 202 generates each output sample of the sample subset 216 as a sum of two samples of the frequency domain samples 112:

$$T_0[k] = H[k] + H\left[k + \frac{N}{2}\right] \tag{1}$$

where:
$T_0$ is output sample subset 216 generated by the preprocessing circuit 202;
H is the frequency domain samples 112;
N is the number of samples in the frequency domain samples 112; and
k is 0 to 63 for N=128.

The preprocessing circuit 204 generates each sample of sample subset 218 as a difference of two samples of the frequency domain samples 112:

$$T_1[k] = H[k] - H\left[k + \frac{N}{2}\right] \tag{2}$$

where $T_1$ is sample subset 218 generated by the preprocessing circuit 202

The linear phase shift circuits 206 and 208 (collectively linear phase shift circuit 207) apply a linear phase ramp to the sample subsets 216 and 218. The linear phase shift circuit 206 applies a linear phase ramp $\theta_0$ (e.g., =−8) to the sample subset 216 to produce a phase rotated sample set 220 (G[k]). The linear phase shift circuit 208 applies a linear phase ramp $\theta_1$ (e.g., =−7) to the sample subset 218 to produce a phase rotated sample set 222 (F[k]). The linear phase shift circuit 206 and the linear phase shift circuit 208 provide a time shift in the frequency domain, e.g., $$G(k) = T_0(k)e^{\frac{-j2\pi\theta_0}{N}}.$$

For example, the linear phase shift circuit 206 provides an 8 tap shift of the sample subset 216, and the linear phase shift circuit 208 provides a 7 tap shift of the sample subset 218.

Figure 3:
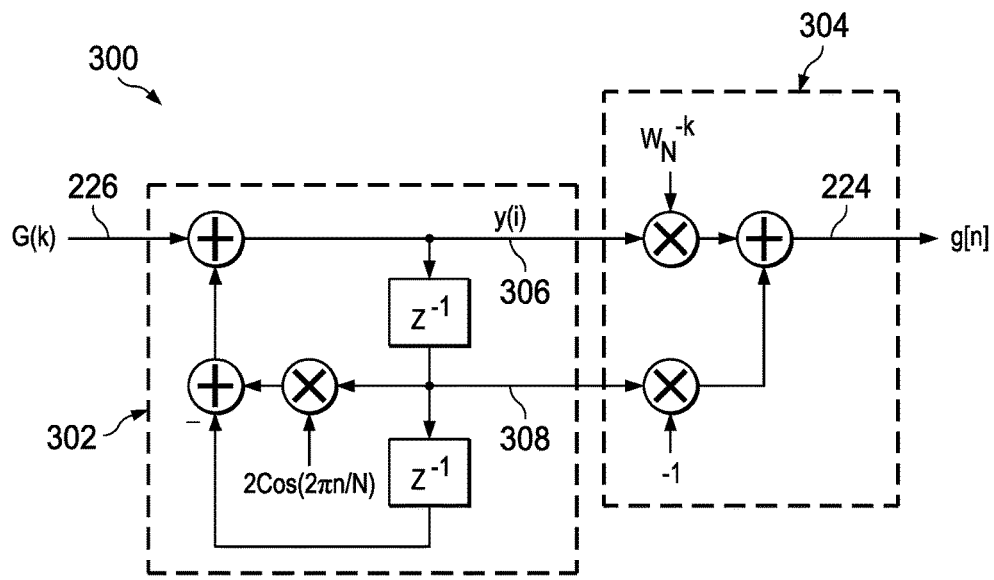
FIG. 3 shows a block diagram for an example post-processing circuit used to convert samples from frequency to time domain in accordance with the present disclosure.

The post-processing circuits 210 and 212 (collectively post-processing circuit 211) transform the phase rotated sample set 220 and the phase rotated sample set 222 from time to frequency domain. In one implementation, the time domain conversion can be performed using a post-processing circuit 210 that generates the coefficients for the even taps of the time domain filter 108, and a post-processing circuit 212 that generates the coefficients for the odd taps of the time domain filter 108. FIG. 3 shows an example block diagram for a post-processing circuit 300 used to convert samples from frequency to time domain in accordance with the present disclosure. The post-processing circuit 300 is an implementation of the post-processing circuit 210 and/or the post-processing circuit 212. The post-processing circuit 300 includes a shared block processing circuit 302 and an independent one-shot post-processing circuit 304 coupled to the shared block processing circuit 302. In one example, samples produced by the linear phase shift circuit 206 (or the linear phase shift circuit 208) are processed by the shared block processing circuit 302 to generate output samples 306 and 308. The output samples 306 and 308 (shared block processing circuit output samples 306 and 308) are processed by the independent one-shot post-processing circuit 304 to produce pairs of time domain samples 224 (or time domain samples 226).

The post processing circuit 300 (time domain conversion circuit 300) computes time domain samples in two steps. First, the shared block processing circuit 302 generates intermediate samples y(k) for desired time domain sample index pairs (n,−n) as follows:

$$y(k) = G(k) + 2\cos\left(\frac{2\pi n}{N}\right) y(k-1) - y(k-2), \text{ for } k = 0, \ldots \frac{N}{2} - 1$$

where this operation is performed N/2 times (e.g., 64) for the frequency domain samples in the phase rotated sample set 220. This is followed by two computations using the independent one-shot post-processing circuit 304, once for computing the time domain sample g(n) and the second time for computing the time domain sample g(-n), for all non-zero indices n as follows:

$$g(n) = y\left(\frac{N}{2}\right) - W_N^n y\left(\frac{N}{2} - 1\right)$$

where $$W_N^n = e^{-j \times 2\pi \frac{n}{N}}.$$

The post-processing circuit 300 is applied to obtain all desired time domain sample pairs, for different values for n. The zero-index time domain sample is computed as the sum of all of the samples of the phase rotated sample set 220.

The structure of the shared block processing circuit 302 is the same for generation of positive and negative indexed time domain samples (±n). The post processing circuit 300 computes the positive and negative indexed time domain samples (g(±n)) using the shared block processing circuit 302 followed by independent computations of the independent one-shot post processing circuit 304. The shared block processing circuit 302 uses a fixed, real twiddle multiplier of $$2\cos\left(\frac{2\pi n}{64}\right)$$

where the phase rotated sample set 220 includes 64 frequency domain samples. Thus, for each tap pair, the shared block processing circuit 302 fetches a single coefficient from memory, which reduces the number of memory accesses needed to perform the conversion.

Computation of the time domain samples time domain samples 226 (f(n)) in the post-processing circuit 212 is similar to computation of the time domain samples 224 (g(n)). The zero-index time domain sample is computed as the sum of all of the samples of the phase rotated sample set 222.

The remapping circuit 214 combines and reorders the time domain samples 224 and time domain samples 226 to produce the time domain samples 116. For example, given the time domain samples 224

[g(−4), g(−3), g(−2), g(−1), g(0), g(1), g(2), g(3), g(4)]

generated by the post-processing circuit 210, and the time domain samples 226

[f(−4), f(−3), f(−2), f(−1), f−0), f(1), f(2), f(3), f(4)]

generated by the post-processing circuit 212, the remapping circuit 214 interleaves the time domain samples 224 and the time domain samples 226 to produce the time domain samples 116 as:

h(n)=[g(−4), f(−3), g(−3), f(−2), g(−2), f(−1), g(−1), f(0), g(0), f(1), g(1), f(2), g(2), f(3), g(3), f(4), g(4)]

Examples of the frequency to time domain conversion circuit 200 and/or the post-processing circuit 300 are implemented as dedicated circuitry configured to perform the functions disclosed herein, or as a processor (e.g., a general-purpose microprocessor or a digital signal processor) that executes instructions fetched from memory to perform the functions disclosed herein.

Some implementations of the frequency to time domain conversion circuit 200 include preprocessing circuitry that produces more than two subsets of samples for phase rotation, and corresponding linear phase shifting, post processing, and remapping circuitry. Each of the subsets of samples includes a predetermined fraction (½, ¼, etc.) of the number of samples of the frequency domain samples 112. For example, an implementation of the frequency to time domain conversion circuit 200 includes four preprocessing circuits that produce four sample subsets ($T_0$, $T_1$, $T_2$, and $T_3$), each including one-quarter the number of samples of the frequency domain samples 112. A linear phase shift circuit applies a phase rotation to each sample subset, a modified post processing circuit 300 produces time domain samples as described herein, and a remapping circuit interleaves the four sets of time domain samples to produce the time domain samples 116. Because the number of samples processed in the post-processing circuit 300 is reduced due to the smaller frequency domain sample subset, the number of iterations of the shared block processing circuit 302 executed to produce a time domain sample is also reduced.

Figure 4A:
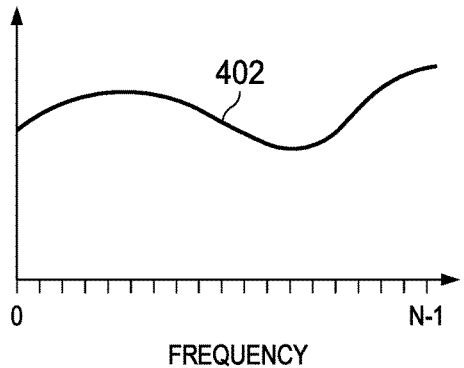
FIGS. 4A-4D show frequency domain samples and time domain samples produced by conversion from frequency domain to time domain in accordance with the present disclosure.
Figure 4C:
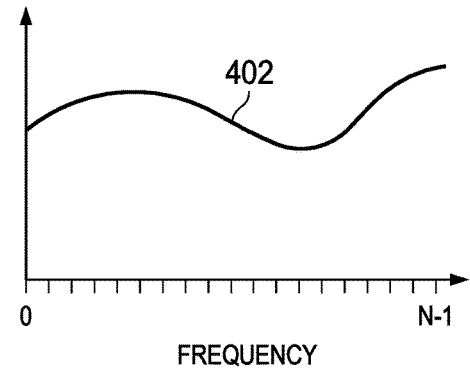
Figure 4B:
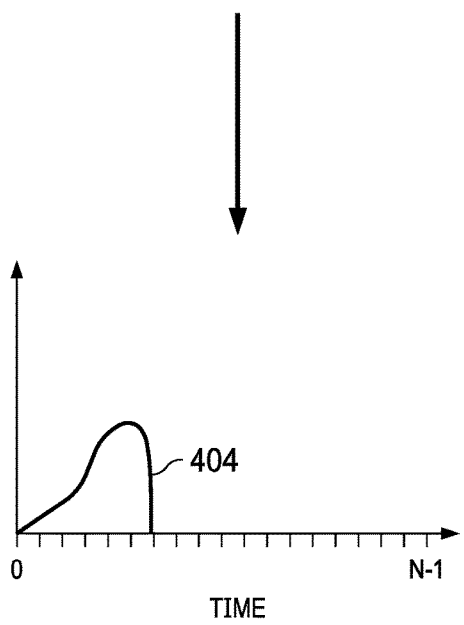

FIGS. 4A-4D show frequency domain samples and time domain samples produced by conversion from frequency domain to time domain in accordance with the present disclosure. In FIG. 4A a set of frequency domain samples 402 are illustrated. In FIG. 4B, a set of time domain samples 404 derived from the frequency domain samples 402 is shown. The time domain samples 404 start at time index 0, and may be produced by applying an inverse fast Fourier transform to the frequency domain samples 402 and discarding the resulting coefficients that are not included in the time domain samples 404. Alternatively, an inverse discrete Fourier transform may be executed for each sample of the time domain samples 404.

Figure 4D:
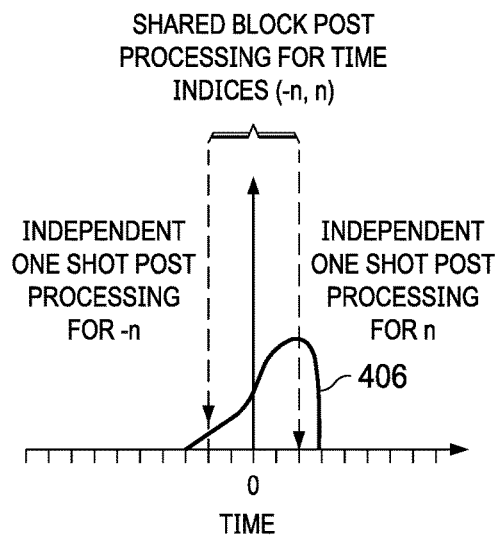

FIG. 4C shows the frequency domain samples 402 (as in FIG. 4A). FIG. 4D shows the time domain samples 406, which include the same values as the time domain samples 404, but are shifted to be centered about time index 0. The time shift is a result of the linear phase rotation applied to the sample subset 216 and the sample subset 218 by the linear phase shift circuit 206 and the linear phase shift circuit 208. The time shift allows the post-processing circuit 300 to provided common block processing to generate time domain samples for positive and negative time indices, with separate one time processing for positive and negative time indices.

Figure 5:
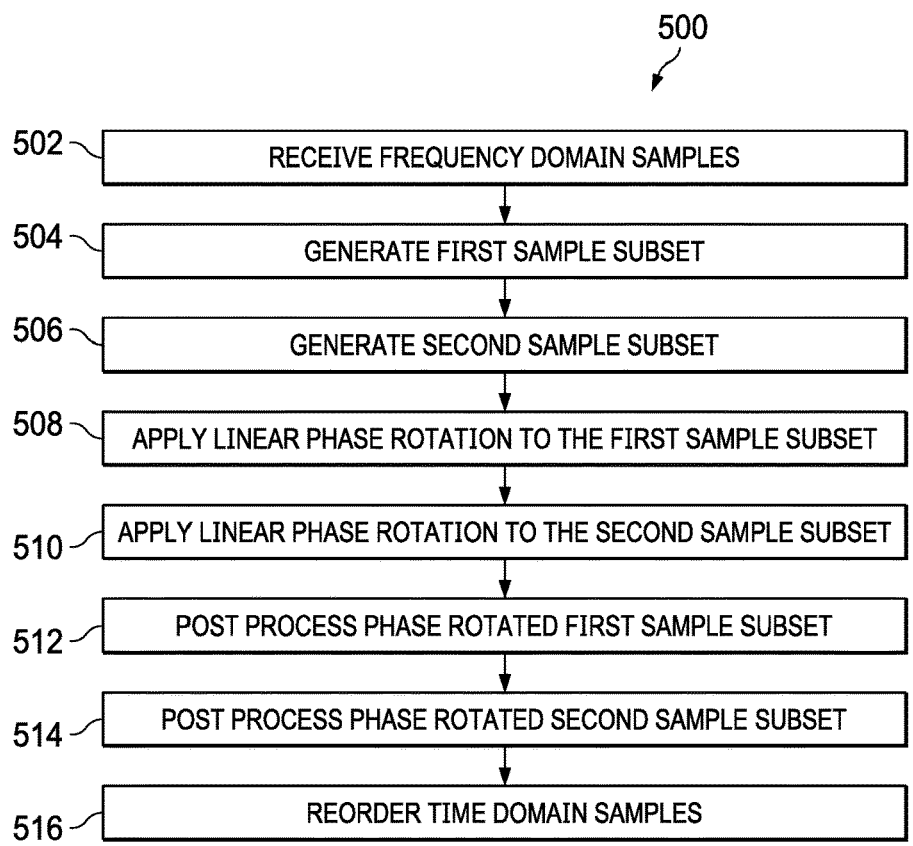
FIG. 5 shows a flow diagram for an example method for converting from frequency domain to time domain in accordance with the present disclosure.

FIG. 5 shows a flow diagram for an example method 500 for converting from frequency domain to time domain in accordance with the present disclosure. Though depicted sequentially as a matter of convenience, at least some of the actions shown can be performed in a different order and/or performed in parallel. Additionally, some implementations may perform only some of the actions shown. Operations of the method 500 are performed by the frequency to time domain conversion circuit 200 in some implementations.

In block 502, the frequency to time domain conversion circuit 200 receives the frequency domain samples 112.

In block 504, the preprocessing circuit 202 generates each sample of the sample subset 216 as a sum of two samples of the frequency domain samples 112 as per equation (1). The sample subset 216 includes one-half the number of samples of the frequency domain samples 112 in some implementations.

In block 506, the preprocessing circuit 204 generates each sample of the sample subset 218 as a difference of two samples of the frequency domain samples 112 as per equation (2). The sample subset 218 includes one-half the number of samples of the frequency domain samples 112 in some implementations.

In block 508, the linear phase shift circuit 206 applies a linear phase rotation to the sample subset 216 to produce the phase rotated sample set 220.

In block 510, the linear phase shift circuit 208 applies a linear phase rotation to the sample subset 218 to produce the phase rotated sample set 222. The phase rotation applied by the linear phase shift circuit 208 is different from the phase rotation applied by the linear phase shift circuit 206.

In block 512, the post-processing circuit 210 processes the phase rotated sample set 220 to produce the time domain samples 224. The post-processing includes applying block processing circuit 300 to the phase rotated sample set 220.

In block 514, the post-processing circuit 212 processes the phase rotated sample set 222 to produce the time domain samples 226. The post-processing includes applying block processing circuit 300 to the phase rotated sample set 222.

In block 516, the remapping circuit 214 reorders and combines the time domain samples 224 and the time domain samples 226 to produce the time domain samples 116.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for frequency to time domain conversion, comprising:
   receiving a set of frequency domain samples;
   generating, based on the set of frequency domain samples:
      a first sample subset comprising a predetermined fraction of the number of samples of the set of frequency domain samples; and
      a second sample subset comprising the predetermined fraction of the number of samples of the set of frequency domain samples;
   applying a linear phase rotation to the first sample subset and the second sample subset to produce a phase rotated first sample set and a phase rotated second sample subset;
   post-processing the phase rotated first sample set to generate a first set of time domain samples;
   post-processing the phase rotated second sample set to generate a second set of time domain samples; and
   reordering the first set of time domain samples and the second set of time domain samples to produce an output set of time domain samples.

2. The method of claim 1, further comprising:
   generating each sample of the first sample subset as a sum of two samples of the set of frequency domain samples;
   generating each sample of the second sample subset as a difference of two samples of the set of frequency domain samples.

3. The method of claim 1, wherein the linear phase rotation applied to the first sample subset is different from the linear phase rotation applied to the second sample subset.

4. The method of claim 1, wherein post-processing the phase rotated first sample set comprises applying a block processing to a block of samples of the phase rotated first sample set to generate a block processed sample set.

5. The method of claim 4, wherein post-processing the phase rotated first sample set comprises applying an independent one shot processing to the block processed sample set to generate the first set of time domain samples.

6. The method of claim 5, wherein applying the independent one shot processing comprises:
   executing a first computation of the independent one shot processing to generate a positive index time domain sample; and
   executing a second computation of the independent one shot processing to generate a negative index time domain sample.

7. The method of claim 1, wherein post-processing the phase rotated second sample set comprises applying a block processing to a block of samples of the phase rotated second sample set to generate a block processed sample set.

8. The method of claim 7, wherein post-processing the phase rotated second sample set comprises applying an independent one shot processing to the block processed sample set to generate the second set of time domain samples.

9. The method of claim 1, wherein:
post processing the phase rotated first sample set comprises generating a zero index sample of the first set of time domain samples as a sum of all the samples of the first phase rotated sample set; and
post processing the phase rotated second sample set comprises generating a zero index sample of the second set of time domain samples as a sum of all the samples of the second phase rotated sample set.

10. The method of claim 1, wherein the reordering comprises interleaving the first set of time domain samples and the second set of time domain samples in order of ascending sample index.

11. A circuit for frequency to time domain transformation, comprising:
a preprocessing circuit configured to:
 receive a set of frequency domain samples;
 generate, based on the set of frequency domain samples:
  a first sample subset comprising a predetermined fraction of the number of samples of the set of frequency domain samples; and
  a second sample subset comprising the predetermined fraction of the number of samples of the set of frequency domain samples;
a linear phase shift circuit coupled to the preprocessing circuit, and configured to:
 apply a first linear phase rotation to the first sample subset to produce a phase rotated first sample set; and
 apply a second linear phase rotation to the second sample subset to produce a phase rotated second sample set;
 wherein the first linear phase rotation is different from the second linear phase rotation;
a post processing circuit coupled to the linear phase shift circuit, and configured to:
 post process the phase rotated first sample set to generate a first set of time domain samples; and
 post process the phase rotated second sample set to generate a second set of time domain samples; and
a remapping circuit coupled to the post processing circuit, and configured to reorder the first set of time domain samples and the second set of time domain samples to produce an output set of time domain samples.

12. The circuit of claim 11, wherein the preprocessing circuit is configured to:
add a first sample of the set of frequency domain samples to a second sample of the set of frequency domain samples to generate a sample of the first sample subset;
subtract the first sample of the set of frequency domain samples from the second sample of the set of frequency domain samples to generate a sample of the second sample subset.

13. The circuit of claim 11, wherein the post processing circuit comprises:
a shared block processing circuit configured to process each sample of the phase rotated first sample set to generate a block processed sample set; and
an independent one shot post processing circuit coupled to the shared block processing circuit, and configured to process the block processed sample set to generate the first set of time domain samples.

14. The circuit of claim 11, wherein the post processing circuit comprises:
a shared block processing circuit configured to process each sample of the phase rotated second sample set to generate a block processed sample set; and
an independent one shot post processing circuit coupled to the shared block processing circuit, and configured to process the block processed sample set to generate the second set of time domain samples.

15. The circuit of claim 11, wherein the post processing circuit is configured to:
sum of all the samples of the first phase rotated sample set to generate a zero index sample of the first set of time domain samples; and
sum of all the samples of the second phase rotated sample set to generate a zero index sample of the second set of time domain samples.

16. The circuit of claim 11, wherein the remapping circuit is configured to interleave the first set of time domain samples and the second set of time domain samples in order of ascending sample index.

17. A mismatch correction system, comprising:
a mismatch estimation circuit configured to estimate, in the frequency domain, an impairment in an input signal;
a frequency domain to time domain conversion circuit coupled to the mismatch estimation circuit, and configured to convert a set of frequency domain samples generated by the mismatch estimation circuit to time domain filter coefficients, the frequency domain to time domain conversion circuit comprising:
 a preprocessing circuit configured to generate, based on the set of frequency domain samples:
  a first sample subset comprising a predetermined fraction of the number of samples of the set of frequency domain samples; and
  a second sample subset comprising the predetermined fraction of the number of samples of the set of frequency domain samples;
 a linear phase shift circuit coupled to the preprocessing circuit, and configured to:
  apply a first linear phase shift to the first sample subset to produce a phase rotated first sample set; and
  apply a second linear phase shift to the second sample subset to produce a phase rotated second sample set;
  wherein the first linear phase shift is different from the second linear phase shift;
 a post processing circuit coupled to the linear phase shift circuit, and configured to:
  process the phase rotated first sample set to generate a first set of time domain samples; and
  process the phase rotated second sample set to generate a second set of time domain samples; and
 a remapping circuit coupled to the post processing circuit, and configured to reorder the first set of time domain samples and the second set of time domain samples to produce the time domain filter coefficients; and
a mismatch correction circuit coupled to the frequency domain to time domain conversion circuit, and comprising:

a time domain filter configured to apply the time domain filter coefficients to correct the input signal.

18. The system of claim 17, wherein the preprocessing circuit is configured to:
add a first sample of the set of frequency domain samples to a second sample of the set of frequency domain samples to generate a sample of the first sample subset;
subtract the first sample of the set of frequency domain samples from the second sample of the set of frequency domain samples to generate a sample of the second sample subset.

19. The system of claim 17, wherein the post processing circuit comprises:
a shared block processing circuit configured to:
process each sample of the phase rotated first sample set to generate a first block processed sample set; and
process each sample of the phase rotated second sample set to generate a second block processed sample set and
an independent one shot post processing circuit coupled to the shared block processing circuit, and configured to:
process the first block processed sample set to generate the first set of time domain samples; and
process the second block processed sample set to generate the second set of time domain samples.

20. The system of claim 17, wherein the post processing circuit is configured to:
sum of all the samples of the first phase rotated sample set to generate a zero index sample of the first set of time domain samples; and
sum of all the samples of the second phase rotated sample set to generate a zero index sample of the second set of time domain samples.

21. The system of claim 17, wherein the remapping circuit is configured to interleave the first set of time domain samples and the second set of time domain samples in order of ascending sample index to generate the time domain filter coefficients.

* * * * *